Jan. 13, 1959
G. L. TUCKER
2,869,054
UNIPOLAR TRANSISTOR
Filed Nov. 9, 1956
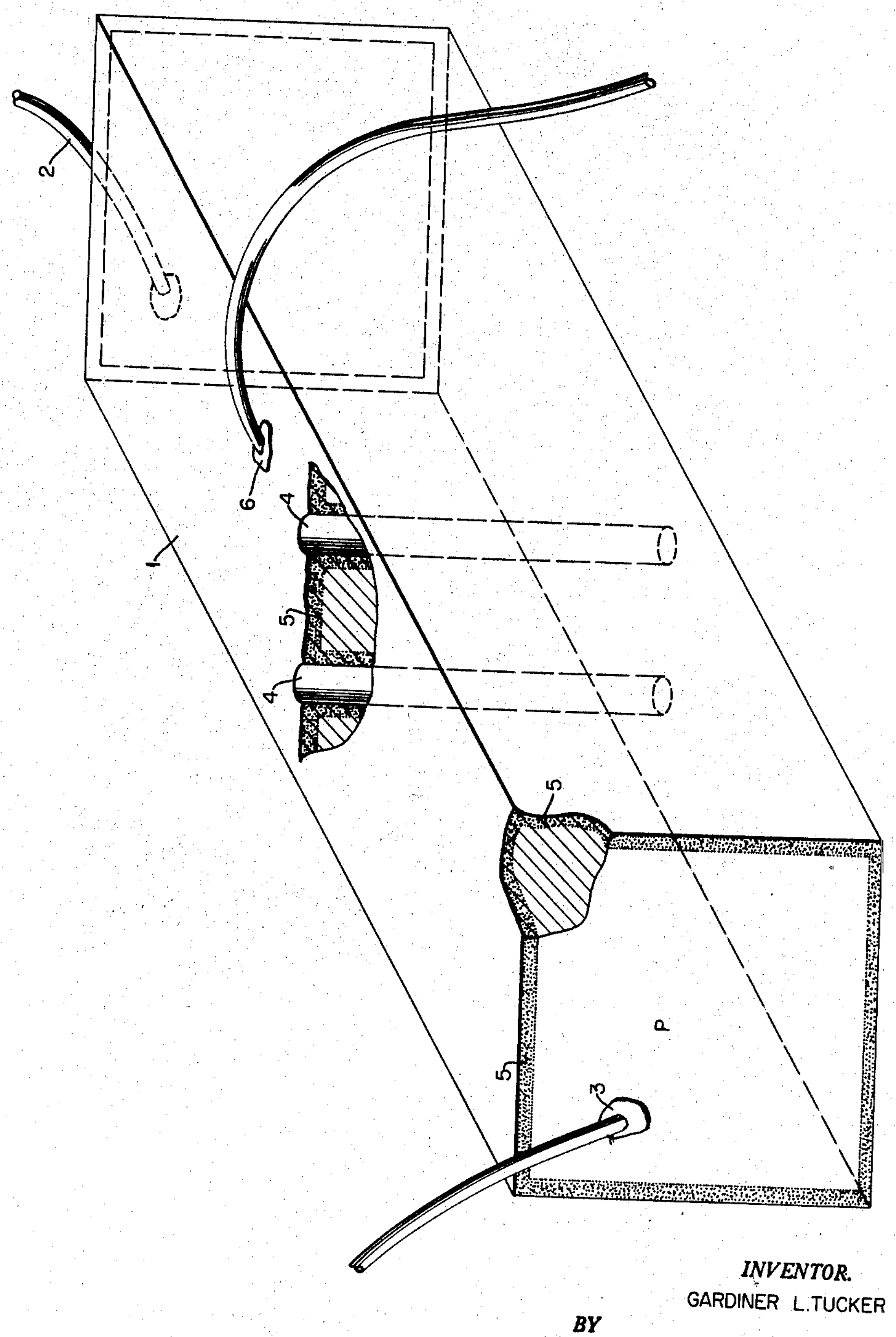
*INVENTOR.*
GARDINER L. TUCKER
*BY*
Alvin J. Riddles
AGENT 2,869,054

UNIPOLAR TRANSISTOR

Gardiner L. Tucker, Glenham, N. Y., assignor to International Business Machines Corporation, New York, N. Y., a corporation of New York Application November 9, 1956, Serial No. 621,268

8 Claims. (Cl. 317—235)

This invention relates to transistors and in particular to a type of transistor known as a unipolar device.

Unipolar, or field effect transistors, have been defined in the art as a structure containing a semiconductor current path, the conductivity of which is modulated by a transverse electric field. Devices of this type have been described in an article entitled "The Field Effect Transistor" by G. C. Dacey and I. M. Ross in the Bell System Technical Journal, November 1955. These transistors have a semiconductor body separating two ohmic contacts and are provided with a P–N junction along the body between the ohmic contacts. The reverse biasing of this junction sets up depletion region in the body which restricts the carrier paths through the body of the transistor and alters the conductivity. One major feature of these devices is the fact that the depletion region associated with the reverse biased junction can be made sufficiently large with proper type of structure so that there is no longer any available area for carrier flow and conduction between the ohmic contacts is essentially cut off. This condition is known in the art as "pinch off," and the reverse biasing potential for the P–N junction necessary to produce the cut off effect is known as the "pinch off voltage."

This invention provides a structure and method of manufacturing of a unipolar or field effect transistor whereby the junction, to which control is applied, is so shaped physically that electric control to cause the phenomenon known as "pinch-off" is facilitated.

A primary object of this invention is to provide an improved field effect transistor structure.

Another object of this invention is to provide a simplified method of manufacturing field effect transistors.

A related object of this invention is to provide field effect transistors having more than one control junction.

Other objects of the invention will be pointed out in the following description and claims and illustrated in the accompanying drawings, which disclose, by way of example, the principle of the invention and the best mode, which has been contemplated of applying that principle.

In the drawings; the figure is a schematic diagram illustrating both the structure of this invention and the method of manufacture.

Referring now to the figure, a schematic diagram of a unipolar type semiconductor device is shown. In the figure a semi conductor crystal body 1 of, for example, germanium or silicon is provided with two ohmic connections 2 and 3 respectively, spaced from each other on the semiconductor crystal body by a distance to be referred to as the carrier transit region and shown in the figure as the length of the semiconductor body.

For purposes of explanation, the semiconductor crystal body 1 will be considered to be P type. The body 1 is provided with a plurality of vertical bores 4 placed in the carrier transit path between the ohmic contacts 2 and 3. The surface layer 5 of the P type body 1 and the interior surfaces of the bores 4 has been converted to N type conductivity by a method to be later described. An ohmic contact 6 is made to the surface layer 5.

The unipolar device of this invention as illustrated by the figure is made by taking a portion of a semiconductor crystal, applying thereto two ohmic contacts spaced from each other and removing a portion of the crystal in the carrier transit path between the ohmic contacts so that, when a surface area of the crystal is converted to the opposite type conductivity, the depletion region associated with the junction so formed will control the carrier transit path. A preferred way of accomplishing this is to place therein a plurality of holes 4 spaced from each other a distance that is dependent upon the characteristics of the semiconductor material selected, as is well known in the art. The dimension between these holes and the edges of the carrier transit path of the semiconductor body is also critical and should not exceed the interhole spacing above described.

In the illustration of the figure the shape of the crystal body 1 is so selected that the lateral dimensions of the crystal define the cross section of the carrier transit path. In the case of oddly shaped crystal bodies it is only necessary that the crystal material removed be of sufficient shape that a surface conductivity conversion of the remaining crystal will provide a junction so shaped that the depletion region associated therewith can control the carrier transit path in the crystal body.

The semiconductor body 1 is next placed in an environment capable of introducing conductivity type directing impurities into the semiconductor body 1 surface so as to change the conductivity type and form thereby a continuous P–N junction. This can be accomplished in many ways established in the art such as alloying, dipping in impurity laden solder or preferably, for example, by the technique known in the art as gaseous diffusion and one method of which is described in the copending application, Serial Number 589,953, filed June 7, 1956, and assigned to the assignee of this application. Under this technique the body 1 is placed in an environment and, assuming the body 1 to be P type germanium as illustrated, an impurity such as an element of group V of the periodic table is diffused into the surface of the body 1, converting the conductivity type of all of the exposed surface to N type conductivity forming thereby the layer 5 and at the same time the surface layer 5 being continuous in the inside surface of the holes 4 the conductivity type is altered here also. This provides one continuous P–N junction under the entire surface of the semiconductor body 1 and around the inside surface of the holes 4.

Portions of the body 1 are then removed so as to expose the original P type region and ohmic contacts such as 2 and 3 are then applied to the original P type materials at locations such that the holes 4 lie in the carrier transit path between these contacts. A third ohmic contact 6 is then made to the surface layer 5 at any convenient point and since the surface layer is continuous, a signal applied to this contact will influence the P–N junction everywhere within the semiconductor device.

In operation, current may now flow between the two ohmic contacts 2 and 3 in response to a difference of potential appearing between them. When a difference of potential is applied between one of the end contacts 2 or 3 and the ohmic contact 6, a depletion region is set up within the body 1 associated with the P–N junction made by the surface layer 5 of opposite type conductivity. This depletion region serves to restrict carrier flow between the contacts 2 and 3 by reducing the cross sectional area of the carrier transit path. As may be seen, when the applied signal to the contact 6 becomes sufficiently high so that the depletion region radiating from the P–N junction under the individual hole surfaces touch each other and the depletion region radiating from the junction at the surface of the body, the carrier transit path is effectively pinched off and the impedance between the ohmic contacts 2 and 3 would be very high.

Due to the geometry of construction of this invention, since the depletion region radiates into the crystal body 1 from many directions "pinch-off" may be accomplished with very low voltages and with very close control.

It should be noted that for effective and accurately reproducible pinch-off voltages, it is important that the interhole spacing of the holes 4 and the distance between the edge of the holes 4 and the edges of the carrier transit path shown in the figure as the the edges of the body 1 be accurately maintained so that the depletion regions will be uniform and equal in thickness. When these items are maintained the transition from an On to an Off condition will be relatively abrupt. It should also be noted that the nature of the depletion region associated with the junction is determined by the resistivity of the material in the P type body so that a degree of control of the magnitude of the signal to be applied on terminal 6 can be exercised through the selection of the resistivity of the P type material of the body 1.

It will be apparent to one skilled in the art that a structural principle and method of manufacture is here described wherein apertures in a crystal body may be positioned between two ohmic contacts separated on the body and all of the exposed surface of the body and these apertures may be provided with one continuous P–N junction in one operation. It will also be apparent to one skilled in the art that groups of apertures such as the holes of the figure may each be connected to a separate signal source so that carrier transit modulation may be provided in such a device from more than one source.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the following claims.

In the claims:

1. A semiconductor device comprising a semiconductor body of one conductivity type, first and second ohmic contacts in spaced relationship attached to said semiconductor body, at least one aperture in said body so located as to be in the carrier transit path between said first and second ohmic contacts, a continuous surface region of said semiconductor body having a conductivity type opposite to said body and forming one continuous P–N junction therewith and a third ohmic contact attached to said surface region.

2. A unipolar transistor comprising a semiconductor body of a first conductivity type having a surface region of the opposite conductivity type, first and second spaced ohmic contacts attached to said body, at least one aperture in said body between said spaced ohmic contacts the inside surface of said aperture being a region of the opposite conductivity type to said first conductivity type of said body and being integral with said opposite conductivity type surface region on said body and a third ohmic contact made to said surface region.

3. A unipolar transistor comprising an elongated shape semiconductor crystal of one conductivity type having at least one hole through the smaller dimension thereof and having one continuous region of opposite conductivity type extending into said crystal from the surface of said crystal and inside said at least one hole forming a single continuous P–N junction in said crystal, first and second ohmic contacts attached to said one conductivity type portion of crystal in spaced relationship along the larger dimension of said elongated shape and a third ohmic contact attached to said surface region.

4. A unipolar transistor comprising a filament of one conductivity type semiconductor material, a first ohmic contact attached to one end of said filament, a second ohmic contact attached to the opposite end of said filament, at least one hole through said filament in a direction transverse to the dimension between said first and second ohmic contacts, one continuous surface region in said semiconductor material of opposite conductivity type extending over all exposed surface of said filament except said ends and forming a single continuous P–N junction therewith and a third ohmic contact attached to said surface region.

5. A method of making a semiconductor device comprising in combination the steps of providing a semiconductor crystal of an original conductivity type, forming at least one aperture in said crystal, converting the surface of said crystal to opposite type conductivity, removing first and second portions of said crystal surface at locations on opposite sides of said at least one aperture exposing said original conductivity type region of said crystal and attaching ohmic contacts to said first and second exposed portions of said original conductivity type crystal and to said opposite conductivity type surface layer.

6. A method of making a semiconductor device comprising in combination the steps of providing a semiconductor crystal of an original conductivity type, forming at least one aperture in said crystal, diffusing opposite conductivity type directing impurities into the surface of said crystal, removing first and second portions of said crystal surface at locations on opposite sides of said at least one aperture thereby exposing said original conductivity type region of said crystal and attaching ohmic contacts to said first and second exposed portions of said original conductivity type crystal and to said opposite conductivity type surface layer.

7. The method of making a unipolar transistor comprising in combination the steps of providing an elongated semiconductor crystal made of a first conductivity type material placing openings in said elongated crystal along the shorter dimension thereof converting the surface of said crystal to a material of a conductivity type opposite to said first type, attaching a first ohmic contact to said first conductivity type material at one end of said elongated crystal attaching a second ohmic contact to said first conductivity type material at the other end of said elongated crystal and attaching a third ohmic contact to said surface layer.

8. The method of making a unipolar transistor comprising in combination the steps of providing an elongated semiconductor crystal of a first conductivity type, drilling a plurality of holes in said elongated crystal at a point between the ends thereof and in a direction transverse to the long dimension thereof, diffusing a quantity of conductivity directing impurity of a type opposite to said first type into the surface of said crystal, removing a portion of said crystal from each end thereby exposing a region of said first conductivity type material of said crystal and applying ohmic contacts to each said exposed region of first conductivity type and to said surface of said crystal.

References Cited in the file of this patent

UNITED STATES PATENTS

| | | |
|---|---|---|
| 2,784,121 | Fuller | Mar. 5, 1957 |
| 2,790,037 | Shockley | Apr. 23, 1957 |